(12) United States Patent
Davis et al.

(10) Patent No.: US 6,362,665 B1
(45) Date of Patent: Mar. 26, 2002

(54) BACKWARDS DRIVABLE MOS OUTPUT DRIVER

(75) Inventors: Christopher K. Davis, Malabar, FL (US); William B. Shearon, Findlay, OH (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/442,291

(22) Filed: Nov. 19, 1999

(51) Int. Cl.$^7$ ................................................ H03B 1/00
(52) U.S. Cl. ...................... 327/108; 327/112; 327/535; 327/538
(58) Field of Search ................................. 327/108, 112, 327/530, 534, 535, 533, 538, 541, 542, 543; 326/82, 83, 86, 87, 90, 91

(56) References Cited

U.S. PATENT DOCUMENTS

| 4,472,648 | A |   | 9/1984  | Prentice |          |
|-----------|---|---|---------|----------|----------|
| 4,782,250 | A |   | 11/1988 | Adams et al. |       |
| 4,783,602 | A |   | 11/1988 | Viswanathan |        |
| 5,160,855 | A |   | 11/1992 | Dobberpuhl |         |
| 5,414,314 | A |   | 5/1995  | Thurber, Jr. |       |
| 5,422,591 | A | * | 6/1995  | Rastegar et al. | 327/537 |
| 5,475,339 | A |   | 12/1995 | Maida |              |
| 5,557,234 | A |   | 9/1996  | Collins |            |
| 5,656,969 | A |   | 8/1997  | Pulvirenti et al. |  |
| 5,764,077 | A | * | 6/1998  | Andresen et al. | 326/83 |
| 5,804,998 | A |   | 9/1998  | Cahill et al. |      |
| 5,818,295 | A |   | 10/1998 | Chimura et al. |     |
| 5,907,259 | A |   | 5/1999  | Yamada et al. |      |
| 5,963,055 | A | * | 10/1999 | Tanaka et al. | 326/81 |
| 5,966,044 | A | * | 10/1999 | Naka | 327/535 |

* cited by examiner

*Primary Examiner*—Timothy P. Callahan
*Assistant Examiner*—An T. Luu
(74) *Attorney, Agent, or Firm*—Jaeckle Fleischmann & Mugel, LLP

(57) ABSTRACT

In a bus driver circuit having a floating gate circuit for controlling voltage on the gate of the output driver and a floating well circuit for controlling voltage on the body of the output driver, the improvement comprising a well pull up circuit coupled to the output driver for applying supply voltage to the body during transmission and for applying the output of the floating gate circuit to the body during quiescence.

4 Claims, 3 Drawing Sheets

BACKWARDS DRIVABLE MOS OUTPUT DRIVER

BACKGROUND OF THE INVENTION

This invention relates generally to an apparatus and method for operating an integrated circuit. In particular, it relates to a MOS output driver that is powered by a 3.3v power supply and may be occasionally connected to a higher supply, such as 5v.

Complementary metal oxide semiconductors (CMOS) are ubiquitous in integrated circuits and systems. CMOS technology continues to shrink and as it shrinks the power supplies that operate the CMOS devices shrink accordingly. At present, many CMOS devices operate with a 3.3v power supply. However, these devices are often connected to peripheral devices in a system or even on the same chip that may operate or otherwise carry a higher voltage, such as 5v. If an output driver on a circuit is connected to a power supply that is greater than the output driver's normal power supply, the greater power supply may inadvertently turn on the driver when the system requires that the driver be off or otherwise in a quiescent state.

As explained later, others have provided solutions to this problem by controlling the voltage on the gate of the driving transistor, as well as controlling the voltage on the well of the driving transistor. If either of those voltages are not properly controlled, then one or more of the two body diodes in the drive transistor may turn on or the mosfet may itself turn on. See, in particular, U.S. Pat. No. 5,160,855 which shows a well voltage control circuit for controlling the voltage on the well of the drive transistor. The well voltage control circuit includes at least four transistors. However, I have found that the well control circuit does not adequately control the output transistor body when the output voltage is close to the value of the supply voltage during transmission.

SUMMARY OF THE INVENTION

The invention provides a bus driver that is less complex than the prior art and solves the problem of a floating well voltage where output voltage is close to the value of the supply voltage during mission. The invention provides a first output driver MOS transistor that has a source, an insulated gate, a body and a drain. This structure includes two inherent diodes. The drain and the body form one diode and the body and the source form the other. A low voltage supply terminal is connected to the source of the MOS transistor and the drain provides the output terminal. The gate terminal receives a gate voltage signal that turns the bus driver MOS transistor on or off. A floating gate control circuit is coupled to the gate and allows the gate to rise with the output voltage on the drain when the output voltage on the drain exceeds the primary supply voltage. This ensures that the normal mosfet conduction does not occur. A well pull up circuit is connected to the floating gate control circuit, the body of the MOS transistor and to the primary supply terminal. The well pull up circuit lets the well float and thereby prevents its inadvertent operation of tuning on one of the body diodes of the MOS transistor. An enable control circuit controls the well pull up circuit. The enable control circuit is high during operation of the bus output driver and low when the bus is quiescent.

DRAWINGS

DETAILED DESCRIPTION

Figure 1A:
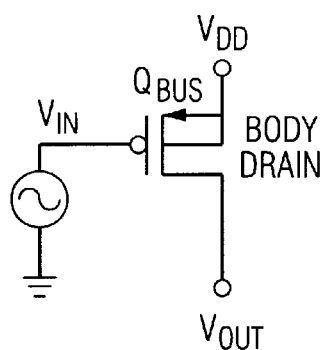
FIG. 1a is a schematic of a single bus driver transistor.
Figure 1B:
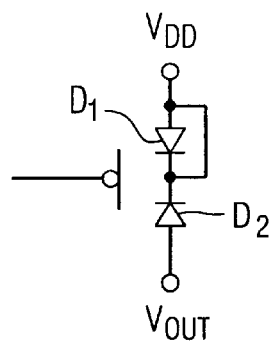
FIG. 1b is a schematic corresponding to 1a and shows the two inherent body diodes.

FIGS. 1a, 1b, 2 and 3 show the problem faced by bus drivers and how the problem is addressed by the circuit disclosed in U.S. Pat. No. 5,160,855. FIG. 1a is a simplified version of a bus driver. The driving transistor $Q_{BUS}$ receives an input signal $V_{IN}$. $Q_{BUS}$ is connected between a power supply $V_{DD}$ and an output terminal $V_{OUT}$. The transistor $Q_{BUS}$ is shown as a PMOS transistor. A PMOS transistor includes P-type diffusions in the surface of a substrate that substantially comprises N-type doping. As a result, the transistor $Q_{BUS}$ has or can be viewed as a structure with two internal diodes such as shown in FIG. 1b. Since the source is coupled to the body, one diode is, in effect, shorted to the drain. The other diode is controlled by $V_{OUT}$. It is important that these diodes that are formed by the respective P-type diffusions and the body of the $Q_{BUS}$ be kept from triggering on. If $V_{OUT}$ exceeds $V_{DD}$, the body diode $D_2$ will be turned on. This is undesirable since, in effect, $Q_{BUS}$ could be turned on at a time when $V_{IN}$ was high. In the ideal bus driver, $Q_{BUS}$ never turns on until $V_{IN}$ is low. Those skilled in the art will appreciate that, in a CMOS device, the output circuit of FIG. 1a will have a corresponding NMOS output transistor.

Figure 2:
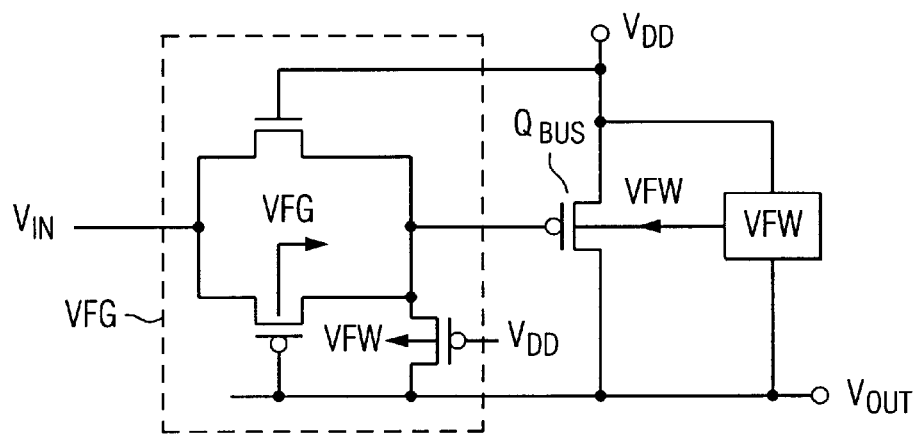
FIG. 2 is a schematic of a prior art bus driver circuit.
Figure 3:
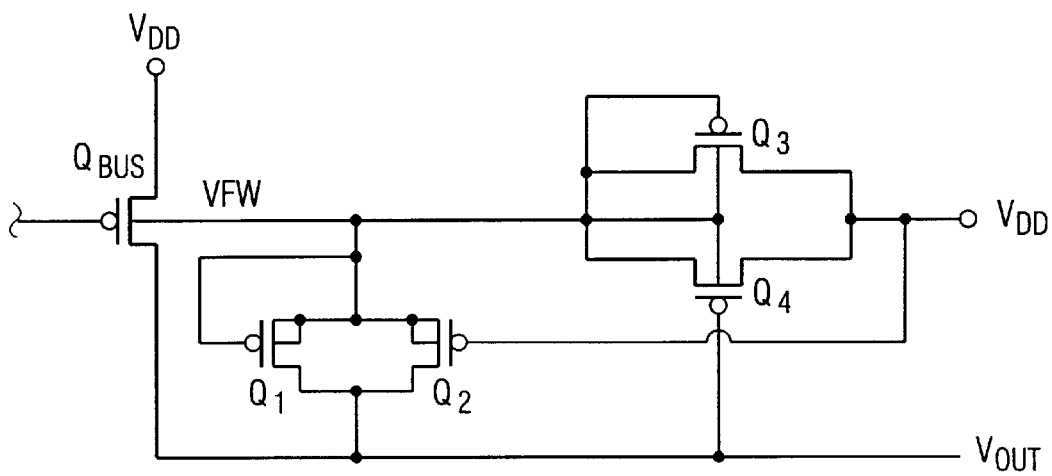
FIG. 3 is a further schematic of the floating gate circuit of FIG. 2.

The circuits shown in U.S. Pat. 5,160,855 and FIG. 2 include a floating gate voltage circuit (VFG) and a floating well voltage circuit (VFW). The VFG circuit is connected between the input $V_{IN}$ and the gate of the output transistor $Q_{BUS}$. The VFW circuit is connected between the output $V_{OUT}$ and the body tie of $Q_{BUS}$. During quiesence the input to VFG is tied to the supply voltage $V_{DD}$. As long as $V_{OUT}$ is less than $V_{DD}$ the gate voltage is tied to $V_{DD}$. The VFG monitors the output voltage and adjusts the gate voltage to follow the output voltage $V_{OUT}$ when $V_{OUT}$ is greater than $V_{DD}$. During transmission, the input of the floating gate circuit may vary between ground and the supply voltage to turn the drive transistor on and off, respectively. In this way, the gate and the drain of the transistor $Q_{BUS}$ are maintained at the same potential when $V_{OUT}$ rises above $V_{DD}$. Accordingly, the transistor $Q_{BUS}$ is prevented from turning on. Of course, the problem of a floating output voltage $V_{OUT}$ also affects the well of the output transistor $Q_{BUS}$. In the prior art solution as shown in FIG. 3, the VFW circuit attempts to adjust the voltages applied to the well of $Q_{OUT}$ in order to prevent unwanted operation. The prior art circuit functions acceptably for conditions when $V_{OUT}$ is significantly less than $V_{DD}$ and when $V_{OUT}$ is significantly greater than $V_{DD}$. However, it experiences problems when $V_{OUT}$ is approximately the same value as $V_{DD}$.

When $V_{OUT}$ is less than $V_{DD}$, transistor Q4 is on and VFW is effectively connected to $V_{DD}$. Accordingly, the diode in the body tie is reverse biased and does not conduct current. That is the condition for normal transmission. When the bus is off and there is no transmission, $V_{OUT}$ may rise to a voltage greater than $V_{DD}$. For example, $V_{DD}$ for a bus is normally 3.3v but elements and devices driven by the bus may be at 5v. Accordingly, $V_{OUT}$ may be much greater than $V_{DD}$. In that case, Q4 is off and Q1 and Q2 are on and VFW follows $V_{OUT}$. The same voltage of $V_{OUT}$ is applied across the body tie diode $D_2$. Since the same voltage is across both terminals of the body tie diode, the diode remains off.

However, the circuit shown in FIG. 3 does not control VFW when $V_{OUT}$ is close to $V_{DD}$. When $V_{OUT}$ is nearly the same as $V_{DD}$, all of the transistors Q1–Q4 are off. At that time, there is no control on VFW. Consequently the body becomes a high impedance node and is susceptible to charge injection through the drain to body capacitance during transmission. The injected charge changes the voltage on the body which then changes the threshold voltage on $Q_{BUS}$. Modulating the threshold voltage in such a way causes signal distortion.

Figure 4:
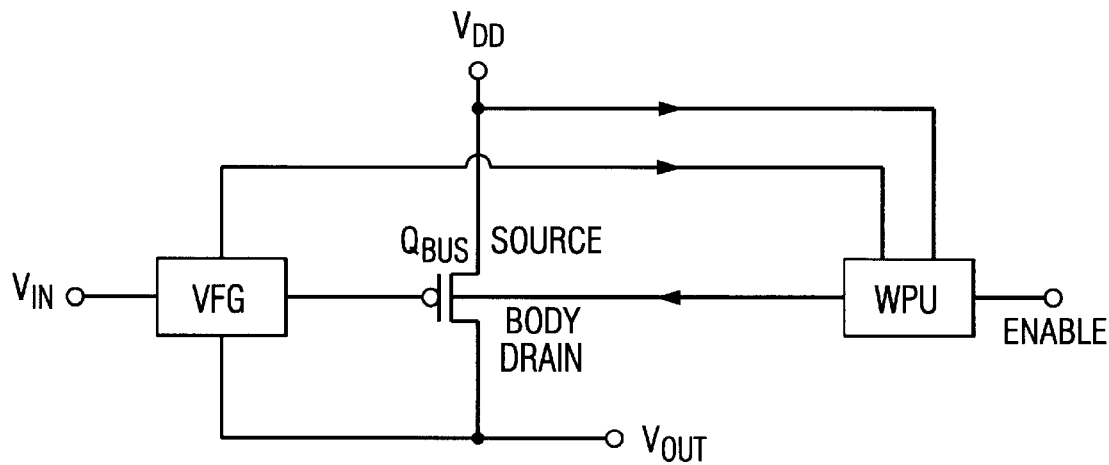
FIG. 4 is a schematic diagram of the invention having a well pull up circuit.
Figure 5:
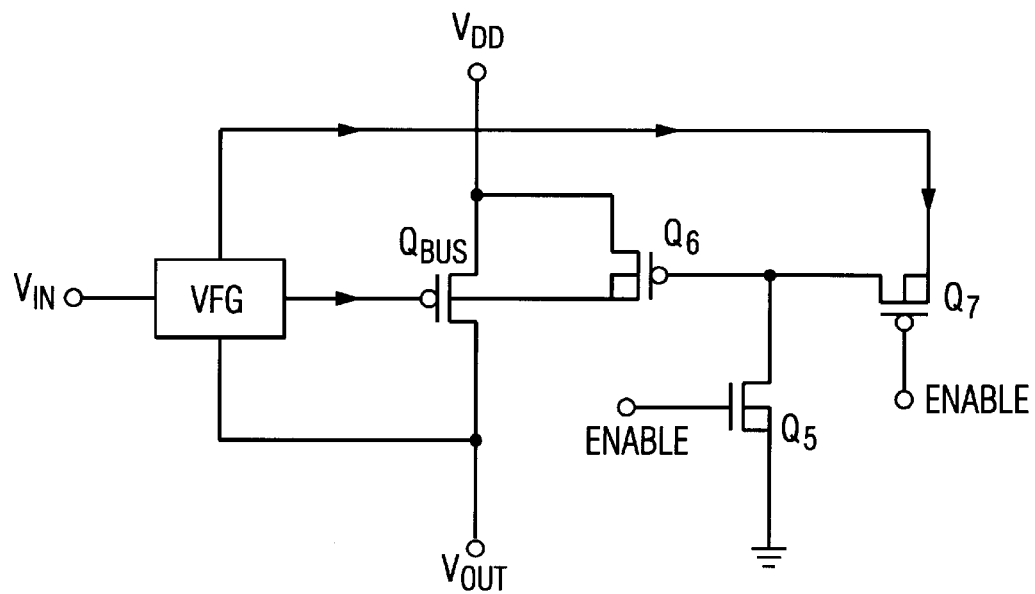
FIG. 5 is a more detailed schematic of the well pull up circuit.

Turning to FIGS. 4 and 5, the invention remedies this deficiency of prior art by adding a well pull up (WPU) circuit to the circuit of FIG. 3 and removing the VFW circuit. The WPU circuit (WPU) is connected to the body of $Q_{BUS}$, the output of the VFG circuit, and to $V_{DD}$. It receives an input enable signal that is derived from one or more of the enable signals that turn on the bus. In operation, the well pull up circuit ensures that the body of the output transistor $Q_{BUS}$ is tied to $V_{DD}$ when the bus is enabled. At all other times, the well pull up circuit allows the body of $Q_{BUS}$ to float electrically so that the drain diode of $Q_{BUS}$ can not conduct current.

With reference to FIG. 5, when the enable signal is high, Q5 is on which turns on Q6. Accordingly, $V_{DD}$ is connected to VFW through Q6 and $V_{DD}$ is applied to the body of $Q_{BUS}$. During transmission the supply voltage $V_{DD}$ is connected to one end of diode $D_2$ and, since $V_{OUT}$ is less than $V_{DD}$ during transmission the diode is reverse biased and does not conduct. When enable is low and the bus is quiescent, Q5 and Q6 are off while Q7 is turned on. Q7 connects the VFG node to the gate of Q6. This is necessary to keep Q6 off when $V_{OUT}$ is backwards driven above $V_{DD}$. Thus, when the circuit is not enabled, the body of $Q_{BUS}$ is allowed to float and can not carry current.

In summary, during operation, when ENABLE is high, Q5 and Q6 are on and so VFW is coupled to $V_{DD}$. This prevents the body diode from floating during transmission and precludes signal distortion due to charge injection into the body. ENABLE is high when the output stage is driving a load. In order to disable the output stage and create a high impedance state, $V_{IN}$ is set high, i.e., to $V_{DD}$ and ENABLE is set low, i.e., to zero volts. This turns off Q5 and turns on Q7. The voltage VFG is used to turn off Q6. VFG, by design, will be greater than or equal to $V_{IN}$. With Q6 off, the body of the output PMOS $Q_{BUS}$ device is allowed to float so that it cannot conduct current.

Figure 6:
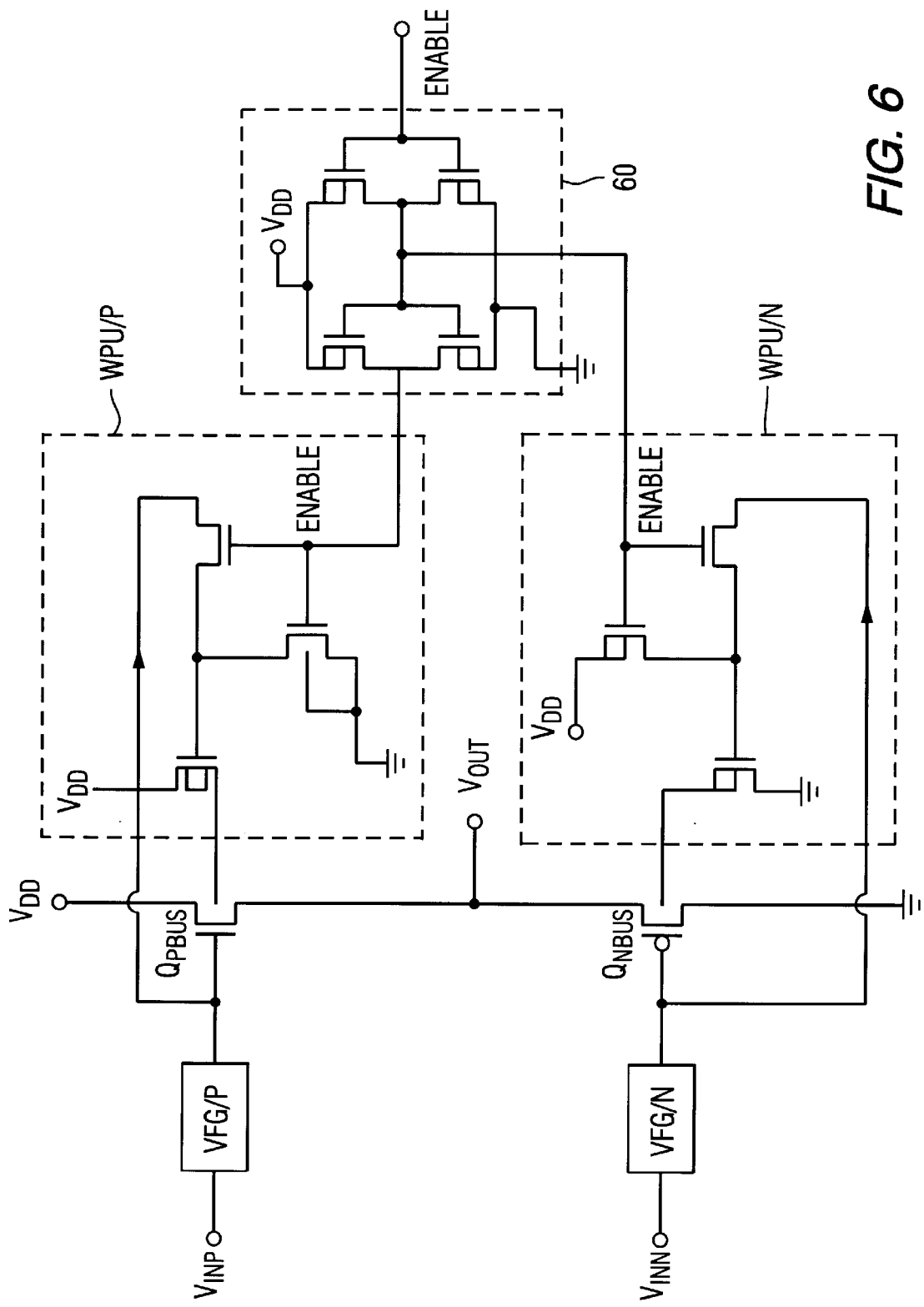
FIG. 6 is a schematic of a CMOS output driver that applies the invention to the NMOS and PMOS transistors.

With reference to FIG. 6, a CMOS output driver is shown. The embodiment includes two output transistors, $Q_{PBUS}$ and $Q_{NBUS}$. The transistors are connected in series with $Q_{PBUS}$ connected to $V_{DD}$ and $Q_{NBUS}$ connected to ground. The output voltage $V_{OUT}$ is taken from the series connection of the transistors $Q_{PBUS}$ and $Q_{NBUS}$. The voltage on the gate of $Q_{PBUS}$ is monitored and controlled by a floating gate circuit, VFG/P. A corresponding floating gate circuit, VFG/N controls the voltage on the gate of $Q_{NBUS}$. The voltage on the well of $Q_{PBUS}$ is controlled by the well pull up circuit WPU/P. In a similar manner, the voltage on the well of $Q_{NBUS}$ is controlled by another well pull up circuit, WPU/N.

An enable control circuit 60 is coupled to WPU/P and to WPU/N. The enable control circuit 60 applies the enable signal to WPU/P and applies the signal enable bar to WPU/N. The operation of WPU/P and WPU/N of FIG. 6 substantially corresponds to the operation of the WPU circuit shown in FIGS. 4 and 5. Those skilled in the art understand that the NMOS transistor may be connected to ground or to a negative power supply. Function and operation of CMOS output drivers is otherwise generally well-known those skilled in the art.

What is claimed:

1. A bus driver circuit comprising:

a first output MOS transistor having a source, an insulated gate, a body and a drain wherein the drain and source and body form two body diodes;

a supply terminal connected to the source of the first output MOS transistor for applying a supply voltage to the first output MOS transistor;

an output terminal connected to the drain of the first output MOS transistor for generating an output voltage in response to an input gate voltage;

a gate terminal connected to the insulated gate of the first output MOS transistor for receiving a gate voltage signal;

a floating gate control circuit coupled to the gate terminal for receiving the input signal and the output signal and for connecting the greater of the input and output signals to the gate terminal when the bus is quiescent;

a well pull up circuit connected to the body of the first output MOS transistor and to the supply terminal for connecting the supply voltage to the well of the first output MOS transistor during transmission and thereby preventing the modulation of the body voltage by charge injection during transmission and for floating the body of the first output MOS transistor during quiescence, said well pull up circuit comprising three transistors, two of the same type as the first output MOS transistor and one of opposite type, wherein a first transistor of the same type is connected to the supply terminal and to the body of the first output MOS transistor, a second transistor of the opposite type has its gate for receiving an enable signal and is connected between ground and the gate of the first transistor, and a third transistor of the same type has its gate connected to the enable signal, its source and drain connected between the gate of the first transistor and the output of the floating gate circuit.

2. The bus driver of claim 1 further comprising a pull up control circuit for receiving the input signal and for generating an enable signal at an enable terminal.

3. The bus driver circuit of claim 1, wherein the first output MOS transistor is one of a PMOS and an NMOS transistor.

4. The bus driver circuit of claim 1, further comprising a second output MOS transistor of a type opposite to the first output MOS transistor, corresponding floating gate, floating well and well pull up circuits for controlling the second output MOS transistor.

* * * * *